United States Patent [19]

Polichette et al.

[11] 3,993,802

[45] *Nov. 23, 1976

[54] PROCESSES AND PRODUCTS FOR MAKING ARTICLES FOR ELECTROLESS PLATING

[75] Inventors: Joseph Polichette, South Farmingdale; Edward J. Leech, Oyster Bay; Francis J. Nuzzi, Freeport, all of N.Y.

[73] Assignee: Photocircuits Division of Kollmorgen Corporation, Glen Cove, N.Y.

[ * ] Notice: The portion of the term of this patent subsequent to Nov. 23, 1993, has been disclaimed.

[22] Filed: July 11, 1974

[21] Appl. No.: 487,748

Related U.S. Application Data

[63] Continuation-in-part of Ser. Nos. 167,432, July 29, 1971, Pat. No. 3,772,056, and Ser. No. 227,446, Feb. 18, 1972, Pat. No. 3,907,621.

[52] U.S. Cl. .................................. 427/98; 96/38.4; 96/48 R; 96/48 PD; 96/49; 96/88; 96/91 R; 96/91 N; 96/92; 96/93; 204/38 B; 427/53; 427/96; 427/97; 427/261; 427/283; 427/405; 428/913

[51] Int. Cl.² ..................... B44D 1/02; B32B 15/00; G03C 5/24; C25D 5/00

[58] Field of Search .................. 96/88, 92, 93, 91 R, 96/91 N, 48 R, 48 PD, 49, 38.4; 117/130 E, 34, 47 A, 93.3, 212, 227, 213, 217, 160 R; 204/38 B; 427/405, 53, 96, 97, 98, 205, 261, 283; 428/913

[56] References Cited

UNITED STATES PATENTS

| | | | |
|---|---|---|---|
| 3,436,233 | 4/1969 | Jackson | 117/130 |
| 3,445,230 | 5/1969 | Francis | 96/88 |
| 3,562,005 | 2/1971 | De Angelo et al. | 117/130 |
| 3,615,732 | 10/1971 | Shipley et al. | 117/130 |
| 3,627,558 | 12/1971 | Roger et al. | 117/47 |
| 3,704,208 | 11/1972 | Russo | 117/47 |
| 3,772,056 | 11/1973 | Polichette et al. | 96/88 |
| 3,772,078 | 11/1973 | Polichette et al. | 96/88 |

*Primary Examiner*—David Klein
*Assistant Examiner*—Richard C. Schilling
*Attorney, Agent, or Firm*—Morgan, Finnegan, Pine, Foley & Lee

[57] ABSTRACT

Sensitizing processes and the resulting new articles of manufacture, suitable for the production of metallized bodies, such as printed circuits, dials, nameplates, metallized plastics, glass, ceramics and the like, comprising bases coated with a halide containing aqueous sensitizing solution of pH 1.5–4.0 that deposits a layer of copper, nickel, cobalt or iron salts or salt compositions, which on exposure to radiant energy, such as heat, light, etc., is converted to a layer of metal nuclei which is non-conductive, but which is capable of catalyzing the deposition of metal onto the base from an electroless metal deposition solution in contact with the metal nuclei.

68 Claims, No Drawings

3,993,802

PROCESSES AND PRODUCTS FOR MAKING ARTICLES FOR ELECTROLESS PLATING

CROSS REFERENCE TO RELATED APPLICATIONS

This application is a continuation-in-part of our application Ser. No. 167,432 filed July 29, 1971 and issued as U.S. Pat. No. 3,772,056 on Nov. 13, 1973 and also of our copending application Ser. No. 227,446 filed Feb. 18, 1972, now U.S. Pat. No. 3,907,621.

BACKGROUND OF THE INVENTION

This invention relates to novel and improved methods for metallizing bodies, e.g., insulating supports, and to the products which result from such methods.

More particularly, the present invention relates to imposing, by thermal or radiant energy, sensitive non-conductive metallic areas on the surfaces of such bodies which catalyze the deposition of strongly adherent and rugged deposits of electroless metal.

Although applicable whenever it is desired to apply a metallic coating to a base, as for example, for decorative or protective effects, or to make electrical conductors of a wide variety of shapes and configurations, the procedures for metallization herein are particularly useful for making printed circuits from readily available base materials, e.g., metal clad laminates, resinous insulating laminated bases or porous non-conductive materials, e.g., fiberglass, paper, cloth, cardboard, ceramics and the like.

It is a primary object of this invention to provide bases sensitive to metallization by electroless plating and, optionally, subsequent electroplated metal deposition.

Another principal object of this invention is to provide improvements in metallization processes in which a base is sensitized to metallization by electroless plating.

An additional object of this invention is to provide base materials and processes for electroless metallization in which there are employed non-noble metal sensitizers which are much more economical in cost, but equivalent in performance to the noble metal-containing sensitizers used until now.

Another object of this invention is to provide adherent electroless metal coatings bonded to base materials either directly or through an intermediate, adhesive layer.

Although the invention will be described with particular reference to printed circuits, and although fabrication of printed circuits constitutes a primary and preferred application, it should be understood that the inventon is not limited to printed circuits but is applicable to metallizing surfaces broadly.

Heretofore, it has been known to employ a number of pretreatment or sensitization baths in effecting the electroless deposition of metals on various surfaces. All such prior art sensitization baths used commercially have been expensive because they depend upon a noble metal, e.g., palladium, platinum, gold, silver, etc., as the sensitizing component. In spite of the expense, however, the prior art has stood fast in its feeling that precious metals must be used if sensitization to electroless metal deposition and good bond strength between the sensitized surface and the electroless deposit is to be achieved. In one embodiment, such prior at noble metal sensitization baths are used sequentially by providing first a film of a Group IV metal ion, e.g., stannous ion, and then a film of reduced precious metal, e.g., reduced palladium, on the surface. In another embodiment, unitary noble metal baths are used, from which there is deposited on the surface a film of colloidal noble metal or a complex of noble metal which is later reduced.

It has now been discovered that adherent electroless metal deposits can be applied to a broad variety of insulating substrates without the need to use expensive noble metals.

In addition, the methods of this invention avoid the flash deposition of precious metals which sometimes causes loss of bond strengths between the electroless metal and the base in prior art procedures.

When following the teachings herein, there can be obtained printed circuits of the highest quality using base metals only in all steps of their production.

SUMMARY OF THE INVENTION

The present invention involves methods for sensitizing a base for subsequent electroless metal deposition by steps that include depositing on said base a layer of a radiation-sensitive composition by treating said base with a solution having a pH between about 1.5 and 4.0 as well as a minor content by weight of at least one halide ion of the group consisting of chloride, bromide, and iodide ions and comprising a reducible salt of a non-noble metal with the cations of said metal present in a larger proportion of equivalents than said halide ions, a radiation-sensitive reducing agent for said salt and a secondary reducer in an aqueous medium, and exposing said layer to radiant energy to reduce said metal salt to metallic nuclei thereby producing a non-conducting layer on said base of said metallic nuclei capable of directly catalyzing the deposition on said nuclei of metal from an electroless metal bath.

Other aspects of this invention relate to the sensitized articles in the form of the bases bearing the layer of radiation-sensitive composition; and also to combination processes in which the foregoing procedure is followed by an electroless metal treatment of the image-bearing substrate to build up a layer of electroless metal on the image. Still other aspects are concerned with preferred materials, formulations and process conditions.

DESCRIPTION OF THE INVENTION

According to the present invention there are provided new articles of manufacture comprising a base and layer on the base, the layer comprising a metal salt or metal salt composition which on exposure to radiant energy, such as heat, light, electron beams, X-rays, etc., is converted to a layer of metal nuclei which is non-conductive and which is capable of catalyzing the deposition of electroless metal from an electroless metal deposition solution in contact with the base, the metal salt being selected from salts of copper, nickel, cobalt, iron or mixtures of any of the foregoing.

According to the present invention there is also provided in a process for producing metallized articles by contacting a base sensitized to the reception of electroless metal with an electroless metal deposition solution, an improvement which comprises providing the base with a layer of a metal salt or metal salt composition which on exposure to radiant energy, such as heat, light, electron beams, X-rays, etc., is convertible to a non-conductive layer of metallic nuclei, and exposing the layer to a suitable source of radiant energy so as to convert it to a non-conducting layer of metal nuclei which are catalytic to the reception of electroless metal, said metal salt being selected from salts of copper, nickel, cobalt, iron or mixtures of any of the foregoing.

In carrying out the present invention, the base is cleaned, if necessary, then coated with the metal salt, e.g., by dip-coating in a solution of the salt, on areas on which it is desired to deposit metal electrolessly. When it is desired to metallize only selected areas of the surface of a body and/or only selected interior portions thereof, e.g., hole walls, suitable masking may be used to protect the areas which are to be free of the metal deposit during as well as after the coating and reduction.

Among the materials which may be used as bases in this invention are inorganic and organic substances, such as glass, ceramics, porcelain, resins, paper, cloth, and the like. Metal-clad or unclad substances of the type described may be used.

For printed circuits, among the materials which may be used as the bases, may be mentioned metal clad or unclad insulating thermosetting resins, thermoplastic resins and mixtures of the foregoing, including fiber, e.g., fiberglass, impregnated embodiments of the foregoing.

Included in the thermoplastic resins are acetal resins; acrylics, such as methyl acrylate, cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile styrene and co-polymers and acrylonitrilebutadiene styrene co-polymers; polycarbonates; polychlorotrifluoroethylene; and vinyl polymers and co-polymers, such as vinyl acetate; vinyl alcohol, vinyl butyral, vinyl cloride, vinyl chloride-acetate co-polymer, vinylidene chloride and vinyl formal.

Among the thermosetting resins may be mentioned allyl phthalate; furane, melamine-formalehyde; phenol formaldehyde and phenolfurfural co-polymers, alone or compounded with butadiene acrylonitrile co-polymers or acrylonitrile-butadiene-styrene copolymers; polyacrylic esters; silicones, urea formaldehydes; epoxy resins; allyl resins; glyceryl phthalates; polyesters; and the like.

Porous materials, comprising paper, wood, fiberglass, cloth and fibers, such as natural and synthetic fibers, e.g., cotton fibers, polyester fibers, and the like, as well as such materials themselves, may also be metallized in accordance with the teachings herein. The invention is particularly applicable to the metallization of resin impregnated fibrous structures and varnish coated resin impregnated fiber structures of the type described.

The bases coated with catalytic metal nuclei generically will include any insulating material so-coated regardless of shape or thickness, and includes thin films and strips as well as thick substrata. An adhesive layer can be on the base, beneath the metal nuclei, e.g., an adhesive which is conventional for this purpose in this art.

The bases referred to herein are inorganic or organic materials of the type described which have surface layer comprising metallic nuclei which are catalytic to the reception of electroless metal, "catalytic" in this sense referring to an agent which is capable of reducing the metal ions in an electroless metal deposition solution to metal.

The catalytic metals for use herein are selected from Period 4 of Groups VIII and IB of the Period Table of the Elements: iron, cobalt, nickel and copper. Particularly preferred is copper. When employing an iron salt as the reducible metal salt, a quick rinse in a suitable strong reducing agent, such as sodium borohyride, after the exposure step is usually desirable for producing maximum density of the deposit.

The catalytic metal, for example in the form of a solution of the reducible salt or reducible salt composition is applied to the base and then reduced on the surface of the base by application of radiant energy, e.g., heat, light, such as ultra-violet light, electron beams, X-rays and the like. If multivalent, the reducible salt can be in any oxidation state, e.g., both, cuprous and cupric, ferrous and ferric, ions may be used.

In one manner of proceeding, a solution of a heat-reducible metal salt, e.g., cupric formate, and optionally a developer, e.g., glycerine, and a surfactant, in a solvent, such as water, is dip-coated onto the base, dried and heated, e.g., at 100° to 170° C., preferably at 130° to 140° C., until the coating has darkened in color, indicating the metallic salt has been reduced to a non-conductive layer of copper nuclei. The base is now catalytic to the deposition of electroless metal on the surface of the base and on the walls in any holes in the base.

In more detail, according to such a heat-activiation process, the base, if necessary, is cleaned and pretreated by one of the methods to be described. The clean base is dip coated in one of the metal salt solutions, to be described in detail hereinafter, for a short time, e.g., 1–3 minutes. The coated base is then placed in a heated area, e.g.., an oven for 10 to 20 minutes, or until the metal salt is reduced to metallic nuclei. The temperature of heating can range from 100° to 170° C., but the preferred range is 130°–140° C. The reduction is considered complete when the coating has darkened in color. The base is then removed from the heated area and allowed to cool. The coating is now catalytic to electroless metal deposition and can be processed in known ways, as will be described hereinafter, for the subsequent build-up of electroless metal plating and, optionally, a top layer of electroplating.

In another manner of proceeding, a solution having a pH in the range of about 1.5 to 4.0 with a content of certain halide ions (i.e., bromide, chloride and/or iodide ions) and comprising a metal salt composition, e.g., cupic formate, and a light-sensitive reducing agent, a second reducing agent, and optionally (for hard to wet surfaces) a surfactant, in water is coated on the base, dried and exposed to ultraviolet light radiation to form a non-conductive layer of metallic nuclei. Suitable light-sensitive reducing agents are aromatic diazo compounds, iron salts, e.g., ferrous or ferric oxalate, ferric ammonium sulfate, dichromates, e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of 1 mg to 2 grams per liter.

Among the second reducers are polyhydroxy alcohols, such as glycerol, ethylene glycol, pentaerythritol, mesoerythritol, 1,3-propanediol, sorbitol, mannitol, propylene glycol, 1,2-butanediol, pinacol, sucrose, dextrin, and compounds such as triethanolamine, propylene oxide, polyethylene glycols, lactose, starch, ethylene oxide and gelatin. Compounds which are also useful as secondary reducers are aldehydes, such as formaldehyde, benzaldehyde, acetaldehyde, n-butyraldehyde, polyamides, such as nylon, albumin and gelatin; leuco bases of triphenyl methane dyes, such as 4-dimethylamino triphenylmethane, 4,4′,4″-tri-dimethylaminotriphenylmethane; leuco bases of xanthene dyes, such as 3,6-bis dimethylamino xanthene and 3,6-bis dimethylamino-9-(2-carboxyethyl) xanthene; polyethers, such as ethylene glycol diethyl ether, diethylene glycol diethyl ether, tetraethylene glycol dimethyl ether, and the like.

A secondary reducer that is also a humectant, as exemplified by sorbitol, is generally preferred as a constituent of the treating solution, for the humectant, apparently by reason of a moisture conditioning effect on the "dry" coating prior to developing, provides substantial aid in maintaining density of the metal coating on the base during a developing step in which any unconverted radiation-sensitive material in the coating is washed off of the base.

Among the suitable surfactants are polyethenoxy nonionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

This treating solution contains an acidifying agent in the form of an acid or acid salt for adjusting the pH of the aqueous solution to usually between about 2.0 and 4.0 (preferably 2.5 to 3.8) and a small quantity of iodide, bromide or chloride ions, so that combination of additives provides a surprising effect in substantially intensifying the density of the coating that is formed subsequently by exposure of the treated substrate to radiant energy. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycerin, etc.) or by some additives for introducing halide ions (e.g., hydrochloric acid). Similarly, some or all of the halide ions may be introduced as components of the reducible metal salt (e.g., cupric chloride).

Among the many suitable acidic substances which may be employed in controlling or adjusting the pH of the sensitizing solution are fluoboric acid, citric acid, lactic acid, phosphoric acid, sulfuric acid, acetic acid, formic acid, boric acid, hydrochloric acid, nitric acid and the like.

A wide variety of bromide, chloride and iodide salts and other halide-generating water soluble compounds may be utilized to provide part or all of the desired halide ion content of the treating solution. These may include, inter alia, salts of metals in general and these halogens as exemplified by cupric bromide, nickel chloride, cobalt chloride, cupric chloride, sodium iodide, potassium iodide, lithium chloride, magnesium iodide, magnesium bromide, sodium bromide, potassium bromide, and the like. Bromide salts are preferred, as they produce a higher degree of sensitivity (i.e., darker and denser deposits) on the substrate than the corresponding chloride in at least certain instances.

The halide ions constitute only a minor proportion of the solute and may typically range from about 0.045 to 1.6% (preferably about 0.13 to 0.45%) based on the total weight of dissolved solids. The amount of halogen may be stated otherwise as between about 0.9 and 25 milliequivalents of halogen per liter of the sensitizing solution, preferably about 2.5 to 9 milliequivalents, e.g., 0.3–1.0 g./l. for cupric bromide. Increasing the proportions of the halide ions is usually undesirable as such increases appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least 2:1 and preferably about 4:1 to 100:1.

The substitution of a compound yielding fluoride ions for a substantial proportion, but not all, of the iodide, bromide or chloride ions in some sensitizer formulations appears to increase the sensitizing effect somewhat.

After exposure to ultraviolet light radiation for a short time the reduction to metallic nuclei is generally complete. If desired, the reduction can be further enhanced by heating at temperatures of up to about 130° to 140° C. for 3 to 5 minutes more. For maximum density in the layer of metallic nuclei, it is generally preferable to develop and rinse the base and carry out the electroless metal treatment described hereinafter within a few hours after such exposure, especially in the case of short exposures to radiant energy. The base is now catalytic to the deposition of electroless metal on the surface of the base and on the walls in any holes in the base in which metal nuclei are exposed.

Typically, the autocatalytic or electroless metal deposition solutions for use in depositing electroless metal on the bodies having a layer of catalytic metal nuclei prepared as described herein comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, nickel, cobalt, silver, gold, tin, rhodium and zinc solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper surface, a reducing agent for cupric ions, e.g., formaldehyde, a complexing agent for supric ions, e.g., tetrasodium ethylenediamine-tetraacetic acid, and a pH adjuster, e.g., sodium hydroxide.

Typical electroless nickel baths which may be used are described in Brenner, Metal Finishing, Nov. 1954, pages 68 to 76, incorporated herein be reference. They comprise aqueous solutions of a nickel salt, such as nickel chloride, an active chemical reducing agent for the nickel salt, such as the hypophosphite ion, and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as gold reserve. The pH of the bath will be about 13.5 or between about 13 and 14, and the ion ratio of hypophosphite radical to insoluble gold salt may be between about 0.33 and 10:1.

Typical electroless cobalt and electroless silver baths are described in the Examples. Electroless tin, rhodium and zinc baths are known by those skilled in the art.

A specific example of an electroless copper deposition bath suitable for use will now be described:

|  | Moles/liter |
| --- | --- |
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C. and will deposit a coating of ductile electroless copper about 1 mil thick in about 5½ hours.

Utilizing the electroless metal baths of the type described, very thin conducting metal films or layers will be laid down on the catalytic metal nuclei. Ordinarily, the metal films superimposed on the catalytic metal nuclei by electroless metal deposition will range from 0.1 to 7 mils in thickness, with metal films having a thickness of even less than 0.1 mil being a distinct possibility.

Among its embodiments, the present invention contemplates metallized substrates in which the electroless metal, e.g., copper, nickel, gold or the like, has been further built up by attaching an electrode to the electroless metal surface and electrolytically, i.e. galvanically, depositing on it more of the same or different metal, e.g., copper, nickel, silver, gold, rhodium, tin, alloys thereof, and the like. Electroplating procedures are conventional and well known to those skilled in the art.

For example, a pyrophosphate copper bath is commercially available for operation at a pH of 8.1 to 8.4, a temperature of 50° C., and a current density of 50 amp./sq.ft. In addition, a suitable fluoborate copper bath is operated at a pH of 0.6 to 1.2, a temperature of 25°–50° C., and a current density of 25 to 70 amp. per sq. ft. and is comprised of:

| copper fluoborate Cu(BF$_4$)$_2$ | 225 – 450 g./l. |
| --- | --- |
| fluoboric acid, HBF$_4$ | 2 – 15 g./l. |
| boric acid, H$_3$BO$_3$ | 12 – 15 g./l. |

For printed circuit application, copper deposits for use as the basic conductor material are usually 0.001 to 0.003 in. thick.

Silver may be deposited galvanically from a cyanide bath operated at a pH of 11.5 to 12, a temperature of 25°–35° C., and a current density of 5–15 amp./sq.ft. An illustrative galvanic silver bath is comprised of:

| silver cyanide, AgCN | 50 g./l. |
| --- | --- |
| potassium cyanide, KCN | 110 g./l. |
| potassium carbonate, K$_2$CO$_3$ | 45 g./l. |
| brighteners | Variable |

Gold may be deposited galvanically from an acid gold citrate bath at pH 5–7, a temperature of 45°–60° C., and a current density of 5–15 amp./sq.ft. An illustrative galvanic gold bath consists of:

| Sodium gold cyanide, NaAu(CN)$_2$ | 20 – 30 g./l. |
| --- | --- |
| dibasic ammonium citrate (NH$_4$)$_2$C$_6$H$_5$O$_7$ | 25 – 100 g./l. |

Nickel can be galvanically deposited at pH 4.5 to 5.5, a temperature of 45° C., and a current density of 20 to 65 amp./sq.ft., the bath containing:

| nickel sulfate, NiSO$_4$ 6H$_2$O | 240 g./l. |
| --- | --- |
| nickel chloride, NiCl$_2$ 6H$_2$O | 45 g./l. |
| boric acid, H$_3$BO$_3$ | 30 g./l. |

Tin and rhodium and alloys can be ganvanically deposited by procedures described in Schlabach et al, Printed and Integrated Circuitry, McGraw-Hill, New York, 1963, p. 146–148.

It is essential in carrying out the process of this invention to use a clean base — otherwise adhesion, as measured by the work needed to peel the electroless metal from the base, will be non-existent. Ordinarily, this will require chemical cleaning and/or polarizing the surface of the base. With adsorbent substrates, e.g., glass cloth, fabrics paper and the like, no special pretreatment is required, but the surface must be clean.

If the base is a metal clad laminate, e.g., having holes drilled through or punched therein, conventional cleaning methods are used to remove all contaminants and loose particles. The surface should be "chemically clean," i.e., free of grease, and surface films. A simple test is to spray the surface with distilled water. If the surface is chemically clean, the water will form a smooth film. If not, the water will break into droplets.

A base can be made clean by scrubbing with pumice or the like to remove heavy soils; rinsing with water; and subsequently removing soiling due to organic substances with a suitable alkaline cleaning composition, e.g.:

| sodium isopropyl naphthalene sulfonate | 3 g./l. |
| --- | --- |
| sodium sulfate | 1 g./l. |
| sodium tripolyphosphate | 14 g./l. |

-continued

| sodium metasilicate | 5 g./l. |
|---|---|
| tetrasodium pyrophosphate | 27 g./l. |

This operation is desirably performed at 160°–180° F.

The surfaces are exposed to the bath for 5 to 30 minutes. Other suitable alkali cleaning compositions, detergents and soaps may be used, taking care in the selection not to have the surface attacked by the cleaner. If present, surface oxides can be removed from metal surfaces with light etchants, such as 25% ammonium persulfate in water, or the cupric chloride etchant of U.S. Pat. No. 2,908,557. On the other hand, if the shape of the base permits, a sanding operation with fine abrasive can also be used to remove oxides.

Unclad resinous substrates, e.g., resinous, e.g., epoxy resins, impregnated fibrous structures and varnish, e.g., epoxy resin varnish, coated resin impregnated fiber structures are best provided with an additonal surface treatment, e.g., the direct bonding pretreatment process of copending U.S. Ser. No. 72,582, filed Sept. 16, 1970, now U.S. Pat. No. 3,723,038, incorporated by reference, to achieve strong adhesion of electroless metal deposits to the base.

This generally comprises treating the base with a suitable organic or inorganic acid, e.g., chromic or sulfuric acid, or base solution to render it porous. In many cases it is desirable to also treat the surface with an agent, e.g., dimethyl formamide or dimethyl sulfoxide before or during the etching process. The effect of such treatment is to render the surface polar.

Depending upon the particular insulating bases involved, other ion exchange imparting materials may be utilized to effect the aforementioned temporary polarization reaction. For example, acidified sodium fluoride, hydrochloric and hydrofluoric acids, chromic acid, borates, fluoroborates and caustic soda, as well as mixtures thereof, have been found effective to polarize the various synthetic plastic resin insulating materials described herein.

In a typical procedure, after treatment with the polarizing agents, the insulating bodies are rinsed so as to eliminate any residual agent, following which they are immersed in a solution containing a wetting agent, the ions of which are base exchanged with the surface of the insulating base to thereby impart to the base relatively long chained ions which also are capable of chemically linking with precious metal ions or ionic complexes containing precious metal ions. Following treatment with the wetting agent, the insulating bodies are rinsed again so as to eliminate the residual wetting agent solution.

DESCRIPTION OF SPECIFIC EMBODIMENTS

The following examples illustrate the methods and articles of this invention. They are not to be construed to limit the invention in any manner whatsoever.

PROCEDURE A

A copper clad epoxy-glass laminate having holes drilled in it for through hole connection is cleaned with a hot alkaline cleaner of the type described above, and all loose particles are removed.

The clean laminate is dip coated for 1-2 minutes in a solution of the following formulation:

| cupric formate | 10 g. |
|---|---|
| anthraquinone 2,6-disulfonic acid disodium salt | 2 g. |
| water | 100 g. |
| glycerine | 1 g. |

The coated substrate is placed in an oven for 10–20 minutes at 130°–140° C. to reduce the layer of copper salt composition to a layer of copper nuclei.

The darkened substrate is removed from the oven and allowed to cool.

An electroless copper layer is deposited on the layer of copper nuclei on the catalytic substrate by immersing it in a bath at 55° C., the bath having the following composition:

| cupric sulfate | 0.03 moles/l. |
|---|---|
| sodium hydroxide | 0.125 moles/l. |
| sodium cyanide | 0.0004 moles/l. |
| formaldehyde | 0.08 moles/l. |
| tetrasodium ethylenediamine tetraacetate | 0.036 moles/l. |
| water | remainder |

The surface of the base and the walls of the holes in the base are covered with a firmly adherent layer of bright, ductile electrolessly deposited copper.

PROCEDURE B

The procedure of Procedure A is repeated, substituting for the copper clad laminate base, an unclad epoxy impregnated glass fiber laminate (Westinghouse M-6528). The base is activated as follows:

a. Treat the surface of the base by immersion for 1 minute in a 1:1 volume of 1,1,1-trichloroethane and dimethyl-formamide (DMF), also containing 1 g./l. of Surfactant 6G (Olin Corp.), and drain for 10 seconds.

b. Place work piece in an "air exhaust chamber" for 2 minutes to selectively evaporate the trichloroethane leaving behind an even wet coating of DMF.

c. Immerse the work piece in an activator solution at 45° C. for 10 minutes, the solution comprising:

| $CrO_3$ | 100 g./l. |
|---|---|
| Conc. $H_2SO_4$ | 300 ml./l |
| Water | to make 1 liter |

(Heated at 100° C. for 1 hour and cooled to 45° C. before use) and drain for at least 30 seconds.

d. Place work piece in a first neutralizer for 5 minutes at room temperature, the first neutralizer bath comprising

| sodium bisulfite | 20 g./l. |
|---|---|
| Surfactant 6G | 1 g./l. |
| $H_2SO_4$ to pH 4.0 | |
| water | to make 1 liter | e. Immerse the work piece for 10 minutes in a second neutralizer bath of the same composition as d.

f. Rinse the work piece in cold running tap water for 10 minutes.

g. Place work piece in hot alkaline rinse at 93° C. for at least 15 minutes, the alkaline rinse comprising 75 g./l. of NaOH and 0.5 g./l. of Surfactant 6G in tap water.

h. Subject the work piece to a final rinse in cold running tap water.

i. Dry in air under normal room conditions.

The activated base is sensitized and an electroless copper layer is deposited thereon by the method of Procedure A.

PROCEDURE C

The process of Procedure A is repeated, substituting an activated epoxy glass laminate as the base (Procedure B) and a metal salt bath of the following composition:

| | |
|---|---|
| cupric formate | 10 g. |
| water | 100 ml. |
| glycerine | 6 g. |
| surface active agent (Triton X-100) | 1 g. |

There are obtained electrolessly metalized bases according to this invention.

PROCEDURE D

A clean polarized epoxy-glass laminate (Procedure B) is dip coated into a metal salt solution of the formula:

| | |
|---|---|
| cupric formate | 10 g. |
| anthraquinone 2,6-disulfonic acid disodium salt | 2 g. |
| water | 1000 ml. |
| glycerine | 10 g. | and allowed to dry at 50°–60° C. for 5 minutes.

The substrate is exposed to ultraviolet light for 1 to 2 minutes, forming a layer of copper nuclei. The substrate is heated for 3 to 5 minutes at 130° to 140° C. A layer of copper is built up in the nuclei by electrolessly depositing copper onto the substrate from a bath as described in Procedure A.

Instead of a resinous body, paper or a woven fabric can be used.

EXAMPLES 1–4

The method of Procedure D is repeated (without heating) substituting the following reducible salt solutions:

EXAMPLE 1

| | |
|---|---|
| cupric formate | 10 g. |
| anthraquinone 2,6-disulfonic acid disodium salt | 3 g. |
| water | 450 ml. |
| glycerine | 30 ml. |
| citric acid | 30 g. |
| stannous chloride | 1 g. |
| fluorocarbon wetting agent (3-M Co., FC-170) | 0.25 g. |

EXAMPLE 2

| | |
|---|---|
| Prepare Part A: | |
| cupric gluconate | 15 g. |
| water | 200 g. |
| Prepare Part B: | |
| fluorocarbon wetting atent (FC-170) | 0.1 g. |
| glycerine | 30 g. |
| citric acid | 30 g. |
| anthraquinone 2,6-disulfonic acid disodium salt | 2 g. |
| stannous chloride | 1 g. |
| water | 250 g. |
| Mix A and B | |

EXAMPLE 3 AND 4

| | | |
|---|---|---|
| Prepare Part A: | | |
| cupric acetate | 15 g. | |
| cupric nitrate | | 15 g. |
| water | 200 g. | 200 g. |
| Prepare Part B: | | |
| wetting agent (FC-170) | 0.25 g. | 0.25 g. |
| glycerine | 30 g. | 30 g. |
| citric acid | 30 g. | 30 g. |
| anthraquinone 2,6-disulfonic acid disodium salt | 3 g. | 3 g. |
| water | 250 g. | 250 g. |
| stannous chloride | 1 g. | 1 g. |
| Mix A and B | | |

EXAMPLE 5

The process of Procedure A is repeated, substituting for the cupric formate solution, the following solution using L-ascorbic acid as the sensitizer:

| | |
|---|---|
| cupric acetate | 4 g. |
| L-ascorbic acid | 5 g. |
| pentaerythritol | 25 g. |
| sorbitol | 30 g. |
| citric acid | 20 g. |
| stannous chloride | 0.5 g. |
| Surfactant 6G | 0.5 g. |
| water (to make) | 1000 ml. |

A substrate metallized according to this invention is obtained.

EXAMPLE 6

The procedure of Example 1 is repeated, substituting for the electroless copper solution, an electroless nickel solution:

| | |
|---|---|
| nickel chloride | 30 g. |
| sodium hypophosphite | 10 g. |
| glycollic acid | 25 g. |
| sodium hydroxide | 12.5 g. |
| water | 1000 ml. |

The pH is adjusted to 4.5 and the bath temperature is maintained at 95° C. A nickel layer is built up on the copper nuclei.

EXAMPLE 7

The procedure of Example 1 is repeated, substituting for the electroless copper solution, an electroless cobalt solution:

| | |
|---|---|
| cobalt chloride | 30 g. |
| sodium hypophosphite | 20 g. |
| sodium citrate dihydrate | 29 g. |
| ammonium chloride | 50 g. |

| | |
|---|---|
| water (to make) | 1000 ml. |

The pH is adjusted to 9.5 and the bath temperature is maintained at 90° C. A cobalt layer is built up on the copper nuclei.

EXAMPLE 8

The procedure of Example 1 is repeated, substituting for the electroless copper solution, an electroless gold solution:

| | |
|---|---|
| gold chloride hydrochloride trihydrate | 0.01 mole/l. |
| sodium potassium tartrate | 0.014 mole/l. |
| dimethyl amine borane | 0.013 mole/l. |
| sodium cyanide | 0.4 mole/l. |
| water | q.s.a.d. |

The pH is adjusted to 13 and the bath temperature is maintained at 60° C. A gold layer is built up on the copper nuclei.

EXAMPLE 9

The procedure of Example 1 is repeated, substituting for the electroless copper solution, an electroless silver solution:

| | |
|---|---|
| silver nitrate | 1.7 g. |
| sodium potassium tartrate | 4 g. |
| sodium cyanide | 1.8 g. |
| dimethyl amine borane | 0.8 g. |
| water (to make) | 1000 ml. |

The pH is adjusted to 13 and the bath temperature is maintained at 80° C. A silver layer is built up on the copper nuclei.

Non-conductive layers of nickel, cobalt and iron nuclei formed in similar manner can also be built up as described for the copper nuclei in these examples with electroless nickel, cobalt, gold and silver.

All such metallized substrates having a layer of electroless metal on top of the nuclei can further be built up with an electroplated layer of copper, silver, gold, nickel, cobalt, tin, rhodium and alloys thereof, using the baths and conditions described hereinabove.

The above disclosure demonstrates that the present process provides for the reduction of a layer of metal salt to a layer of metallic nuclei by means of radiant energy such as heat or light. The layer of nuclei has been shown to be catalytic to adherent electroless metal deposition and this metal can be further built up in thickness with electroplated metal.

EXAMPLE 10

A resinous laminated base is polarized according to Procedure B. Holes are provided in the base at preselected cross over points. The base is coated with a metal salt solution of the following formulation:

| | |
|---|---|
| cupric acetate | 8 g. |
| anthraquinone 2,6-disulfonic acid disodium salt | 16 g. |
| pentaerythritol | 50 g. |
| sorbitol | 60 g. |
| citric acid | 40 g. |

| | |
|---|---|
| stannous chloride | 0.5 g. |
| Surfactant 6G | 1 g. |

The base is allowed to dry at 50°–60° C. for 5 minutes. The dry coating on the upper surface of the base is then exposed to an ultraviolet light source for 2 minutes. Ultraviolet light is also directed down into the whole walls. Next, the unexposed metal salts are removed with a warm water rinse. The base is then exposed to an electroless copper solution (as described in Procedure A), and electroless copper is deposited on the walls of the holes and also on the upper metal film.

Next, if desired, the base can be connected to an electrode in an electrolytic metal deposition solution to deposit additional metal on the walls of the holes and also the upper surface.

EXAMPLE 11

A resinous insulating base is provided with a uniform layer of an adhesive by dip coating in the following composition:

| | |
|---|---|
| acrylonitrile-butadiene copolymer (Paracryl CV, manufactured by Naugatuck Chemical Div.) | 72 g. |
| phenolic resin (SP-8014, manufactured by Schnectady Chemical Co.) | 14 g. |
| methyl ethyl ketone | 1200 g. |

The adhesive coated base is heated until cured, treated with a chromic-sulfonic solution then dipped into the metal salt formulation of Example 10.

The base is dried at 55°–60° C for 5 minutes, then exposed to ultraviolet light for two minutes, forming a layer of copper nuclei on the adhesive layer. The base is then exposed to an electroless copper solution (as described in Example 1), and electroless copper is deposited on the nuclei layer on the adhesive coating.

Next, if desired, the base can be connected as an electrode in an electrolytic metal deposition solution to deposit additional metal.

The polarization treatment described above provides a very active surface to which the metal salt strongly adsorbs and ultimately there is formed a strong bond between the base and the electrolessly deposited metal.

EXAMPLE 12

Starting with about 800 ml. of water, another metal salt sensitizing formulation is prepared by adding the other constituents one at a time in the order listed hereinafter and thoroughly mixing the solution under yellow light.

| | |
|---|---|
| sorbitol | 120 g. |
| 2,6-anthraquinone disulfonic acid disodium salt | 16 g. |
| cupric bromide | 0.5 g. |
| cupric acetate | 8 g. |
| Surfactant 6G | 1.5 g. |
| water | sufficient for 1 liter |
| aqueous fluoboric acid - 40% | sufficient to adjust pH to 3.5 |

After preparation at room temperature, this solution is employed in treating the several substrates described in Procedure D while following in general that method both in the sensitizing and subsequent processing steps, including electroless copper deposition.

In the case of a clean, polarized epoxy-glass laminate with perforations therein, the panel is immersed for 3–5 minutes in a bath of the above solution maintained at 40° C., drained with careful removal of excess solution from the holes, dried, normalized at room temperature and 30–60% relative humidity, exposed to ultraviolet radiation and developed by immersion for 2 minutes in a tank containing cold running tap water; all of which steps are performed under yellow light. The exposure to ultraviolet light is carried out in a two-sided Scanex II Printer provided with a 4800 watt air-cooled mercury vapor lamp on each side and situated 8 inches away from the vacuum frame with the exposure set at 4.5–5.0 feet per minute.

In repeating the treatment with another panel under the same conditions except for omitting the cupric bromide and fluoboric acid from the metal salt sensitizing solution, it is observed that a considerably denser layer of copper nuclei is formed on the epoxy-glass laminate with the formulation of this example than with the formulation devoid of halide and fluoboric acid.

It has been observed that the sensitizer solution of this invention is quite stable and can be employed for periods of more than six months with only a little attention, such as filtering the solution each work day and checking its specific gravity along with a weekly check and adjustment as necessary to maintain a pH of 3.5 at 20° C., a metal salt content equivalent to 7.8 to 8.5 grams of cupric acetate per liter and an anthraquinone salt content of 15 to 16 grams per liter.

PROCEDURE E

Numerous samples of clean, polarized epoxy-glass laminates are subjected to steps of sensitization through exposure and development of layers of copper metal nuclei similar to those of Example 12 except for employing different sensitizing baths and an exposure of 2 minutes to a 1500-watt ultraviolet light source in forming test images through a Stouffer 21-step tablet or optical wedge.

The composition of the control sensitization bath is:

| | |
|---|---|
| sorbitol | 120 g. |
| anthraquinone 2,6-disulfonic acid disodium salt | 16.2 g. |
| potassium bromide | 1.0 g. |
| cupric acetate | 9.0 g. |
| Surfactant 6G | 1.5 g. |
| water     sufficient for | 1 liter |
| pH | 4.62 |

The Stouffer tablet is a mask having 21 small squares of graduated optical density for the graduated transmission of light through different squares in the series. These squares range in density from a completely transparent square designated No. 0 and permitting 100% transmission of ultraviolet light to an opaqure square No. 20 that transmits no light. After development and drying of the exposed laminate surfaces, they are examined to observe the number of square test images visible on the laminates as a measure of the effectiveness of the sensitizing treatment. A product with a sensitivity rating of at least 5 images is desirable, and ratings of 7 or more are preferred.

EXAMPLES 13–30

Varying amounts of a number of different acids are thoroughly mixed with separate baths of the sensitizing formulation of Procedure E to adjust the mixtures to various pH levels in illustrating the important effect of acidity in the treating solutions employed in the present process. For comparative purposes, Trials I and II and their data are included.

In each of the following examples, one or more specimens of the epoxy-glass bases are treated at each specified pH value, processed and rated according to Procedure E; and the specific data and results are set forth in the table hereinafter.

TABLE I

| Example | Acid Additive | pH | Individual Specimen Sensitivity Ratings | | | Average Sensitivity Rating |
|---|---|---|---|---|---|---|
| Control | none | 4.62 | 6 | 5 | 7 | 6.0 |
| I* | citric acid | 1.4 | 3 | 5 | 5 | 4.3 |
| 13 | citric acid | 2.05 | 6 | 6 | 7 | 6.3 |
| 14 | citric acid 45 g./liter | 2.1 | 7 | — | — | 7.0 |
| 15 | citric acid 22.5 g./l. | 2.4 | 8 | — | — | 8.0 |
| 16 | citric acid | 2.5 | 10 | 10 | 11 | 10.3 |
| 17 | citric acid 10.0 g./l. | 2.6 | 10 | — | — | 10.0 |
| 18 | citric acid | 2.92 | 8 | 9 | 11 | 9.3 |
| 19 | citric acid | 3.5 | 8 | 8 | 9 | 8.3 |
| 20 | citric acid | 3.96 | 8 | 8 | 10 | 8.6 |
| II* | fluoboric acid —40% aqueous | 1.06 | 0 | 0 | 0 | 0 |
| 21 | fluoboric acid | 2.20 | 8 | 10 | 9 | 9.0 |
| 22 | fluoboric acid | 2.5 | 8 | 10 | 9 | 9.0 |
| 23 | fluoboric acid | 2.90 | — | 10 | 9 | 10.5 |
| 24 | fluoboric acid | 2.96 | 8 | 10 | 11 | 9.6 |
| 25 | fluoboric acid | 3.5 | — | 10 | 10 | 10.0 |
| 26 | fluoboric acid | 3.7 | 7 | 7 | 7 | 7.0 |
| 27 | fluoboric acid | 4.0 | 7 | 8 | 8 | 7.7 |
| 28 | phosphoric acid —80% aqueous 200 drops/liter | 2.05 | 8 | — | — | 8.0 |
| 29 | phosphoric acid 140 drops/l. | 3.15 | 10 | — | — | 10.0 |
| 30 | sulfuric acid | 2.0 | 7 | — | — | 7.0 |

*Trial runs for comparison of results.

In preparing the treating solutions of the foregoing examples, turbidity is sometimes encountered in the control and other baths having a pH of the order of 3.5 or higher whereas the more acid mixtures are clear. However, this does not pose any serious problems for the turbidity is usually rather slight and does not interfere with sensitization; moreover the suspended solid matter may be easily filtered out of the liquid.

Another observation is that darker images (i.e., denser deposits) are obtained with sensitizing solutions containing either fluoboric or citric acid rather than phosphoric or sulfuric acid.

By means of additional experiments wherein clean glass slides rather than laminates are processed according to Procedure E with several of the solutions in the table of examples and then subjected to the same abrasion test, it can be demonstrated that solutions containing fluoboric acid or phosphoric acid as the acid additive produce deposits with stronger adhesion to the glass substrate than treating agents containing citric or sulfuric acid. In some instances, it may be desirable to employ a mixture of two or more acids (e.g., citric and phosphoric acids) for adjusting the pH of the sensitizing solution in order to obtain a product having a combination of desired properties, such as a dense metal coating that exhibits superior adhesion to the base.

Further illustrations of the processes and products of this invention are set in the examples tabulated hereinafter for varying the processing under controlled and comparable conditions, particularly in respect to demonstrating the effects of variations of acid and halide agents and concentrations thereof by addition of the specified substances to stock sensitizing solutions. Although, generally employing the technique of Procedure E unless otherwise indicated, the following examples differ from those of Table I in including an electroless copper deposition step in a "copper strike bath" with a subsequent sensitivity rating observation of the dried article as a better evaluation.

PROCEDURE F

For more acidity comparisons, a stock sensitizer solution is made up as before, but without the addition of any acid. The pH is 4.78, and its composition in grams per liter of aqueous solution is:

| | |
|---|---|
| sorbitol | 120 |
| 2,6-anthraquinone disulfonic acid disodium salt | 16 |
| cupric acetate | 8 |
| cupric bromide | 0.5 |
| Surfactant 6G | 2.0 |

The pH of samples of this stock solution is then adjusted to specific values with suitable amounts of citric, lactic, and fluoboric acids. Additionally, several high pH samples were prepared, using sodium hydroxide to adjust the pH.

Test panels of clean, polarized epoxy-glass laminates are sensitized in those solutions, dried, exposed, developed and immersed in an electroless copper bath. The drying cycle is three minutes and exposure to UV light consists of two passes on a Scanex II photoprinter, one at a setting of 4.6 feet per minute, and the other at 13.0 feet per minute. Panels are developed in cold running water for 60 seconds, and then immersed immediately in a room temperature copper strike bath for 20 minutes. Photosensitivity is determined by exposure through the 21-step Stouffer optical density wedge with the following results.

TABLE II

| Example | Acid | pH | Sensitivity Ratings Before Cu Strike | Sensitivity Ratings After Cu Strike |
|---|---|---|---|---|
| Control | none | 4.78 | 3 | 4 |
| 31 | fluoboric | 4.00 | 7 | 7 |
| 32 | fluoboric | 3.75 | 8 | 8 |
| 33 | fluoboric | 3.50 | 9 | 8.5 |
| 34 | fluoboric | 3.00 | 8 | 8 |
| 35 | fluoboric | 2.50 | 7 | 7 |
| 36 | fluoboric | 2.00 | 6 | 6 |
| 37 | fluoboric | 1.50 | 6 | 6 |
| Trial III | fluoboric | 0.82 | 4 | 3 |
| 38 | lactic | 4.00 | 6 | 7 |
| 39 | lactic | 3.75 | 8 | 8 |
| 40 | lactic | 3.50 | 8 | 8 |
| 41 | lactic | 3.00 | 7 | 7 |
| 42 | lactic | 2.50 | 7 | 7 |
| 43 | lactic | 2.00 | 6 | 6 |
| 44 | lactic | 1.60 | 3 | 3 |
| 45 | citric | 4.10 | 7 | 7 |
| 46 | citric | 3.70 | 10 | 8 |
| 47 | citric | 3.48 | 11 | 9 |
| 48 | citric | 3.00 | 8 | 7 |
| 49 | citric | 2.50 | 7 | 7 |
| 50 | citric 20 g./l. | 1.90 | 7 | 6 |
| 51 | citric 30 g./l. | 1.68 | 6 | 5 |
| 52 | citric 40 g./l. | 1.62 | 6 | 4 |
| Trial IV | (NaOH) | 6.40* | 2 | 1 |
| Trial V | (NaOH) | 11.50* | 0 | 0 |

Note:
*At a pH of 6.4, a precipitate formed; this redissolved at the higher pH.

From consideration of the Table I and II examples, it is evident that treating solutions containing the aforesaid halide ions and acidic material improve the sensitizing insulating substrates at pH levels in the range of about 1.5 to 4.0 and that a significantly higher degree of sensitization is realized with a pH of 2.0 to 4.0 (particularly between 2.5 and 3.8) than is obtainable with more acid or less acid solutions under comparable conditions.

EXAMPLES 53–64

In demonstrating the results obtainable with Procedure F using mixtures or halides other than cupric bromide, another aqueous stock solution is made up without the addition of cupric bromide or acid. The composition in grams per liter of solution is:

| | |
|---|---|
| sorbitol | 120 |
| 2,6-anthraquinone disulfonic acid disodium salt | 16 |
| cupric acetate | 8 |
| Surfactant 6G | 2 |

Various halide compounds are then added to samples of this stock solution in such quantity as to provide a halide ion concentration of 4.5 milliequivalents which is equal to 0.5 g./l. of cupric bromide. The pH of each sample is then adjusted to 3.50, if necessary, using fluoboric acid. In Example 54, more than 4.5 milliequivalents of hydrochloric acid is employed to accomplish the dual function of providing halide ions and adjusting the acidity of the sensitizing bath; hence no fluoboric acid is incorporated into this solution. The halide mixture of Examples 63 and 64 contain 2.25 milliequivalents of each of the cupric bromide and the sodium fluoride or iodide liter of sensitizer solution.

TABLE III

| Example | Halide | pH | Sensitivity Rating |
|---|---|---|---|
| Control | none | 3.50 | 3 |
| 53 | HCl | 3.50 | 4 |
| 54 | HCl* | 3.50 | 4 |
| 55 | CuCl$_2$ | 3.50 | 6 |
| 56 | HI* | 3.40 | 4 |
| 57 | NaI | 3.50 | 7 |
| 58 | NaI** | 3.50 | 6 |
| Trial VI | NaI | 6.00 | 2 |
| Trial VII | NaI | 11.5 | 2 |
| 59 | KI | 3.30 | 6 |
| 60 | KI | 1.50 | 0 |
| 61 | bromine-water | 3.50 | 7 |
| 62 | CuBr$_2$ | 3.50 | 8 |
| 63 | CuBr$_2$+NaF | 3.50 | 9 |
| 64 | CuBr$_2$+NaI | 3.50 | 7 |

*HCl or HI in larger amount as the sole acid.
**Sensitizing solution filtered before use.

Trials with sensitizing solutions employing fluoride ions as the sole halide do not appear to increase sensitization over the control. While iodides alone tend to precipitate part of the copper content of the sensitizer as cuprous iodide, this does not interfere, in most instances, with the production of good coating. Moreover, the precipitate may be removed by filtering.

EXAMPLES 65–73

For appraising the effect of halide concentration in sensitizer solutions, a large batch of the stock solution of Examples 53–64 is prepared and 40% aqueous fluoboric acid is added to lower the pH to 3.50. This batch is then divided into ten baths and cupric bromide is dissolved with thorough mixing in the proportions specified in Table IV. Then epoxy-glass laminates are treated and evaluated as in Procedure F with the following results:

TABLE IV

| Example | CuBr$_2$-g./l. | pH | Sensitivity Rating After Cu Strike |
|---|---|---|---|
| Control | 0 | 3.50 | 2 |
| 65 | 0.5 | 3.50 | 8 |
| 66 | 1.0 | 3.50 | 7 |
| 67 | 1.5 | 3.50 | 6 |
| 68 | 1.75 | 3.50 | 6 |
| 69 | 2.0 | 3.50 | 6 |
| 70 | 2.5 | 3.50 | 6 |
| 71 | 3.0 | 3.50 | 4 |
| 72 | 4.0 | 3.50 | 3 |
| 73 | 5.0 | 3.50 | 0 |

From the data in Table IV, it is apparent that the concentration of halide ion is important for improving the efficiency of sensitizing baths. Amounts of halide ions above about 25 milliequivalents per liter markedly reduce sensitization. Accordingly, it is desirable to keep the cupric bromide concentration between about 0.1 and 2.5 grams per liter, and preferably between about 0.3 and 1.0 g./l. Similarly desirable proportions for other bromide or halide agents may be computed from the ranges for cupric bromide on a chemical equivalent basis.

Also, unsatisfactory results are obtained when attempts are made to repeat the Table IV examples with the cupric acetate omitted from the sensitizer. This is interpreted as an indication that the number of equivalents of copper or other cation of the reducible non-noble metal salt should be in excess of the number of equivalents of halide ion in the sensitizing solution. In general, a substantial excess is preferred, as exemplified by a 5:1 or greater ratio of metal: halide equivalent weights.

It is further evident from the foregoing data that both the acidity level and halide ion concentration must be within the aforesaid limited ranges to obtain the full benefits of the present invention. A combination effect is involved here, as neither factor alone can provide those advantages. The data in Tables I and II demonstrate that substantial losses in the sensitizing effect occur when the pH of the sensitizer is below 1.5 or above 4.0 even with a preferred amount of halide in solution. In Table IV, marked reductions in sensitization are noted even with the pH at the preferred 3.5 level for solutions containing either no copper bromide or an excessive quantity, e.g., 3 or more grams per liter.

The invention in its broader aspect is not limited by the specific steps, methods, compositions and improvements shown and described herein, and departures may be made within the scope of the accompanying claims without departing from the principles thereof.

We claim:

1. In a process for producing metallized articles by contacting a base sensitized to the reception of an electroless metal with an electroless metal deposition solution, the steps which comprise depositing on said base a layer of radiationsensitive composition by treating said base with a solution having a pH between about 1.5 to 4.0 as well as a minor content by weight of at least one halide ion of the group consisting of chloride, bromide and iodide ions and comprising a reducible salt of a non-noble metal, with the cations of said metal present in a larger proportion of equivalents than said halide ions, a radiation-sensitive reducing agent for said salt and a secondary reducer in an aqueous medium, and exposing said layer to radiant energy to reduce said metal salt to metallic nuclei thereby producing a non-conducting layer on said base of said metallic nuclei capable of directly catalyzing the deposition on said nuclei of metal from an electroless metal bath.

2. A process as defined in claim 1 wherein said base is a porous material.

3. A process as defined in claim 1 wherein said base is a non-metallic resinous base with a polarized surface.

4. In a process for producing metallized articles by contacting a base sensitized to the reception of an electroless metal with an electroless metal deposition solution, the steps which comprise depositing on said base a layer of radiation-sensitive composition by treating said base with a solution having a pH between about 1.5 and 4.0 as well as a minor content by weight of at least one halide ion of the group consisting of chloride, bromide and iodide ions and comprising a reducible salt of a non-noble metal, with the cations of said metal present in a larger proportion of equivalents than said halide ions, a radiation-sensitive reducing agent for said salt and a secondary reducer in an aqueous medium, and exposing said layer to radiant energy to reduce said metal salt to metallic nuclei thereby producing a non-conducting layer on said base of said metallic nuclei capable of directly catalyzing the deposition on said nuclei of metal from an electroless metal bath wherein said base is a metal clad insulating base.

5. A process as defined in claim 1 wherein said metal salt is reduced to metallic nuclei by exposure to light.

6. A process as defined in claim 1 wherein said metal salt is reduced by exposure to ultraviolet light.

7. A process as defined in claim 1 wherein said salt is of the group consisting of reducible salts of copper, nickel, cobalt and iron.

8. A process as defined in claim 1 wherein said reducing agent is a light-sensitive reducing compound of the group consisting of iron salts, dichromates, anthraquihone disulfonic acids and salts, glycine and L-ascorbic acid.

9. A process as defined in claim 8 wherein said secondary reducer is a polyhydroxy alcohol.

10. A process as defined in claim 1 wherein sad radiationsensitive reducing agent comprises anthraquinone 2,6-disulfonic acid disodium salt.

11. A process as defined in claim 10 wherein said liquid medium contains citric acid and a polyhydroxy alcohol secondary reducer of the group consisting of glycerine, sorbitol, pentaerythritol and mesoerythritol.

12. A process as defined in claim 1 wherein said base is thereafter exposed to an electroless metal bath to build up a layer of said electroless metal on said layer of metallic nuclei.

13. A process as defined in claim 12 wherein the treated base is dried before the exposure to radiant energy and said base is rinsed after said exposure to radiant energy and prior to the exposure to said electroless metal bath.

14. A process as defined in claim 12 wherein said electroless metal is of the group consisting of copper, nickel, cobalt, silver, gold, tin, rhodium and zinc.

15. A process as defined in claim 12 wherein said salt is of the group consisting of reducible salts of copper, nickel, cobalt and iron, and said electroless metal is of the group consisting of copper, nickel, cobalt, silver, gold, tin, rhodium and zinc.

16. A process as defined in claim 12 wherein said salt is a reducible copper salt and said electroless metal is copper.

17. A process as defined in claim 1 wherein said solution contains between about 0.9 and 25 milliequivalents of said halide ions based on the total weight of said solution.

18. A process as defined in claim 1 wherein said solution contains bromide ions.

19. A process as defined in claim 17 wherein said solution contains cupric bromide.

20. A process as defined in claim 1 wherein said solution contains a humectant.

21. A process as defined in claim 20 wherein said secondary reducer comprises sorbitol.

22. A process as defined in claim 1 wherein the pH of said solution is between about 2.5 and 3.8.

23. An article which comprises a base bearing a layer of a radiation-sensitive composition having a minor content of at least one halogen of the group consisting of chlorine, bromine and iodine and comprising a reducible salt of a non-noble metal with the content of said metal amounting to a larger proportion of equivalents than said halogen, a radiation-sensitive reducing agent for said salt, a secondary reducer and an acid.

24. An article as defined in claim 23 wherein said base is a porous material.

25. An article as defined in claim 23 in which said base is a non-metallic resinous base having a polarized surface underlying said layer of radiation-sensitive composition.

26. An article which comprises a base bearing a layer of a radiation-sensitive composition having a minor content of at least one halogen of the group consisting of chlorine, bromine and iodine and comprising a reducible salt of a non-noble metal with the content of said metal amounting to a larger proportion of equivalents than said halogen, a radiation-sensitive reducing agent for said salt, a secondary reducer and an acid wherein said base is a metal clad, non-metallic base.

27. An article as defined in claim 23 wherein said reducing agent is a light-sensitive reducing compound of the group consisting of iron salts, dichromates, anthraquinone disulfonic acids and salts, glycine and L-ascorbic acid.

28. An article as defined in claim 23 wherein said salt is of the group consisting of reducible salts of copper, nickel, cobalt and iron, and said reducing agent is a light-sensitive reducing compound of the group consisting of iron salts, dichromates, anthraquinone disulfonic acids and salts, glycine and L-ascorbic acid.

29. An article as defined in claim 23 wherein said radiation-sensitive composition comprises a reducible copper salt, anthraquinone 2,6-disulfonic acid disodium salt as said radiation-sensitive, reducing agent, stannous chloride, citric acid and a secondary reducer of the group consisting of glycerine, sorbitol, pentaerythritol and mesoerythritol.

30. An article as defined in claim 23 wherein said secondary reducer is a polyhydroxy alcohol.

31. An article as defined in claim 23 wherein said metal salt is of the group consisting of reducible salts of copper, nickel, cobalt, iron and mixtures thereof capable of reduction to a non-conductive layer of nuclei of said metal and capable of catalyzing the deposition of electroless metal from an electroless metal deposition solution in contact with said nuclei.

32. An article as defined in claim 31 wherein said radiation-sensitive composition is sensitive to radiant energy of the group consisting of heat, light, X-rays and electron beams.

33. An article as defined in claim 31 wherein said electroless metal is of the group consisting of copper, nickel, cobalt, silver, gold, tin, rhodium and zinc.

34. A process as defined in claim 33 wherein said metal salt is a copper salt and said electroless metal is copper.

35. An article as defined in claim 23 wherein said radiation-sensitive composition contains a bromide compound.

36. An article as defined in claim 23 wherein said radiation-sensitive composition contains between about 0.13 and 0.45% cupric bromide based on the weight of said layer.

37. An article as defined in claim 23 wherein said radiation-sensitive composition contains a humectant.

38. An article as defined in claim 27 wherein said secondary reducer comprises sorbitol.

39. A process as defined in claim 4 wherein said metal salt is reduced to metallic nuclei by exposure to light.

40. A process as defined in claim 4 wherein said metal salt is reduced by exposure to ultraviolet light.

41. A process as defined in claim 4 wherein said salt is of the group consisting of reducible salts of copper, nickel, cobalt and iron.

42. A process as defined in claim 4 wherein said reducing agent is a light-sensitive reducing compound of the group consisting of iron salts, dichromates, anthraquinone disulfonic acids and salts, glycine and L-ascorbic acid.

43. A process as defined in claim 42 wherein said secondary reducer is a polyhydroxy alcohol.

44. A process as defined in claim 4 wherein said radiation-sensitive reducing agent comprises anthraquinone 2,6-disulfonic acid disodium salt.

45. A process as defined in claim 44 wherein said liquid medium contains citric acid and a polyhydroxy alcohol secondary reducer of the group consisting of glycerine, sorbitol, pentaerythritol and mesoerythritol.

46. A process as defined in claim 4 wherein said base is thereafter exposed to an electroless metal bath to build up a layer of said electroless metal on said layer of metallic nuclei.

47. A process as defined in claim 46 wherein the treated base is dried before the exposure to radiant energy and said base is rinsed after said exposure to radiant energy and prior to the exposure to said electroless metal bath.

48. A process as defined in claim 46 wherein said electroless metal is of the group consisting of copper, nickel, cobalt, silver, gold, tin, rhodium and zinc.

49. A process as defined in claim 46 wherein said salt is of the group consisting of reducible salts of copper, nickel, cobalt and iron, and said electroless metal is of the group consisting of copper, nickel, cobalt, silver, gold, tin, rhodium and zinc.

50. A process as defined in claim 46 wherein said salt is a reducible copper salt and said electroless metal is copper.

51. A process as defined in claim 4 wherein said solution contains between about 0.9 and 25 milliequivalents of said halide ions based on the total weight of said solution.

52. A process as defined in claim 4 wherein said solution contains bromide ions.

53. A process as defined in claim 51 wherein said solution contains cupric bromide.

54. A process as defined in claim 4 wherein said solution contains a humectant.

55. A process as defined in claim 54 wherein said secondary reducer comprises sorbitol.

56. A process as defined in claim 4 wherein the pH of said solution is between about 2.5 and 3.8.

57. An article as defined in claim 26 wherein said reducing agent is a light-sensitive reducing compound of the group consisting of iron salts, dichromates, anthraquinone difulfonic acids and salts, glycine and L-ascorbic acid.

58. An article as defined in claim 26 wherein said salt is of the group consisting of reducible salts of copper, nickel, cobalt and iron, and said reducing agent is a light-sensitive reducing compound of the group consisting of iron salts, dichromates, anthraquinone disulfonic acids and salts, glycine and L-ascorbic acid.

59. An article as defined in claim 26 wherein said radiation-sensitive composition comprises a reducible copper salt, anthraquinone 2,6-disulfonic acid disodium salt as said radiation-sensitive reducing agent, stannous chloride, citric acid and a secondary reducer of the group consisting of glycerine, sorbitol, pentaerythritol and mesoerythritol.

60. An article as defined in claim 26 wherein said secondary reducer is a polyhydroxy alcohol.

61. An article as defined in claim 26 wherein said metal salt is of the group consisting of reducible salts of copper, nickel, cobalt, iron and mixtures thereof capable of reduction to a non-conductive layer of nuclei of said metal and capable of catalyzing the deposition of electroless metal from an electroless metal deposition solution in contact with said nuclei.

62. An article as defined in claim 61 wherein said radiation-sensitive composition is sensitive to radiant energy of the group consisting of heat, light, X-rays and electron beams.

63. An article as defined in claim 61 wherein said electroless metal is of the group consisting of copper, nickel, cobalt, silver, gold, tin, rhodium and zinc.

64. A process as defined in claim 63 wherein said metal salt is a copper salt and said electroless metal is copper.

65. An article as defined in claim 26 wherein said radiation-sensitive composition contains a bromide compound.

66. An article as defined in claim 26 wherein said radiation-sensitive composition contains between about 0.13 and 0.45% cupric bromide based on the weight of said layer.

67. An article as defined in claim 26 wherein said radiation-sensitive composition contains a humectant.

68. An article as defined in claim 57 wherein said secondary reducer comprises sorbitol.

* * * * *

UNITED STATES PATENT AND TRADEMARK OFFICE
CERTIFICATE OF CORRECTION

PATENT NO. : 3,993,802
DATED : November 23, 1976
INVENTOR(S) : Joseph Polichette and Edward J. Leech It is certified that error appears in the above–identified patent and that said Letters Patent are hereby corrected as shown below:

On the title page, in the first column, Item 75, delete the name of Francis J. Nuzzi.

In Col. 20, line 31, correct "to" to read -- and --.

In Col. 21, lines 8-9, correct "anthraquihone" to read -- anthraquinone --; on line 13, correct "sad" to read -- said --.

In Col. 24, line 2, correct "difulfonic" to read -- disulfonic --.

Signed and Sealed this

Third Day of May 1977

[SEAL]

Attest:

RUTH C. MASON
*Attesting Officer*

C. MARSHALL DANN
*Commissioner of Patents and Trademarks*